(12) United States Patent
Taoka

(10) Patent No.: US 10,374,593 B2
(45) Date of Patent: Aug. 6, 2019

(54) SEMICONDUCTOR DEVICE

(71) Applicant: FUJI ELECTRIC CO., LTD., Kawasaki-shi, Kanagawa (JP)

(72) Inventor: Masahiro Taoka, Matsumoto (JP)

(73) Assignee: FUJI ELECTRIC CO., LTD., Kawasaki-shi, Kanagawa (JP)

( * ) Notice: Subject to any disclaimer, the term of this patent is extended or adjusted under 35 U.S.C. 154(b) by 162 days.

(21) Appl. No.: 15/279,606

(22) Filed: Sep. 29, 2016

(65) Prior Publication Data

US 2017/0019092 A1    Jan. 19, 2017

Related U.S. Application Data

(63) Continuation of application No. PCT/JP2015/073912, filed on Aug. 25, 2015.

(30) Foreign Application Priority Data

Sep. 29, 2014  (JP) ................. 2014-198778

(51) Int. Cl.
  *H03K 17/08* (2006.01)
  *H03K 17/082* (2006.01)
  (Continued)

(52) U.S. Cl.
  CPC ............ *H03K 17/082* (2013.01); *H02M 1/08* (2013.01); *H03K 3/011* (2013.01);
  (Continued)

(58) Field of Classification Search
  CPC ............ H02H 3/04; H02H 5/041; H02H 3/08; H02H 3/085; H02H 3/087;
  (Continued)

(56) References Cited

U.S. PATENT DOCUMENTS 6,459,380 B1 *  10/2002  Watanabe ............... H02M 1/32
                                                                 340/635
6,934,139 B2 *   8/2005  Kumagai ................ H02M 1/32
                                                                 361/103

(Continued)

FOREIGN PATENT DOCUMENTS

EP        1056205 A2    11/2000
JP       H08-70580 A     3/1996
(Continued)

OTHER PUBLICATIONS

JP 2014-264683. Dec. 26, 2014. (Year: 2014).*

*Primary Examiner* — Ronald W Leja
*Assistant Examiner* — Christopher J Clark
(74) *Attorney, Agent, or Firm* — Rabin & Berdo, P.C.

(57) ABSTRACT

A signal indicating temperature of an IGBT chip, after input into an overheat detection terminal, is simultaneously input into a first comparator for protection operation and a second comparator for precaution. At a normal time when the chip temperature is low, a first transistor connected to an alarm signal output terminal via a resistor and a second transistor connected to the alarm signal output terminal via a Zener diode are turned off, and the alarm signal output terminal whose voltage is pulled up by an external pull-up circuit is set to high level voltage. When the second comparator detects a precaution condition, the second transistor is turned on, and the alarm signal output terminal is set to intermediate level voltage. When the first comparator detects chip overheat, the first transistor is turned on, and the alarm signal output terminal is set to low level voltage.

10 Claims, 10 Drawing Sheets

(51) Int. Cl.
 *H03K 3/011* (2006.01)
 *H02M 1/08* (2006.01)
 *H02M 1/32* (2007.01)
(52) U.S. Cl.
 CPC ... *H03K 17/0822* (2013.01); *H02M 2001/327* (2013.01); *H03K 2017/0806* (2013.01)
(58) Field of Classification Search
 CPC ..... H02H 5/04–048; H02H 7/10; H02M 1/08; H02M 2001/327; H03K 17/082; H03K 17/00–98
 See application file for complete search history.

(56) References Cited

U.S. PATENT DOCUMENTS

| | | | | |
|---|---|---|---|---|
| 9,337,719 | B2* | 5/2016 | Nakamori | H02M 7/48 |
| 9,768,763 | B2* | 9/2017 | Terasawa | H03K 17/18 |
| 2002/0039269 | A1* | 4/2002 | Kumagai | H02M 1/32 |
| | | | | 361/93.1 |
| 2004/0228057 | A1* | 11/2004 | Mayama | H03K 17/0822 |
| | | | | 361/100 |
| 2009/0072984 | A1* | 3/2009 | Cheng | G01R 31/40 |
| | | | | 340/653 |
| 2011/0317315 | A1* | 12/2011 | Motohashi | H02H 7/122 |
| | | | | 361/18 |
| 2012/0146782 | A1* | 6/2012 | Komatsu | H03K 17/0822 |
| | | | | 340/501 |
| 2014/0009983 | A1* | 1/2014 | Nakamori | H02M 1/32 |
| | | | | 363/50 |
| 2017/0077919 | A1* | 3/2017 | Nakamori | H02M 1/00 |

FOREIGN PATENT DOCUMENTS

| | | |
|---|---|---|
| JP | 2000-341960 A | 12/2000 |
| JP | 3635988 B2 | 4/2005 |
| JP | 2009-225581 A | 10/2009 |
| JP | 2012-143125 A | 7/2012 |
| WO | WO-2009/116235 A1 | 9/2009 |
| WO | WO 2015076014 A1 * | 5/2015 ............ H03K 17/18 |

* cited by examiner

SEMICONDUCTOR DEVICE

CROSS-REFERENCE TO RELATED APPLICATION

This application is a continuation application of International Application PCT/JP2015/073912 filed on Aug. 25, 2015 which designated the U.S., which claims priority to Japanese Patent Application No. 2014-198778, filed on Sep. 29, 2014, the entire contents of which are incorporated herein by reference.

BACKGROUND OF THE INVENTION

1. Field of the Invention

The present embodiments relate to a semiconductor device.

2. Background of the Related Art

An electric power converter device uses a semiconductor device configured as an intelligent power module (IPM) that contains a power semiconductor switching element and a control IC including a drive circuit for driving the power semiconductor switching element and a protection circuit in one package. An insulated gate bipolar transistor (IGBT), a metal oxide semiconductor field effect transistor (MOSFET), or the like is used as the power semiconductor switching element.

The control IC includes the protection circuit that detects abnormality, such as chip overcurrent and chip overheat, of the power semiconductor switching element to protect the power semiconductor switching element and outputs an alarm to the outside from an alarm signal terminal of the package. When a chip of the power semiconductor switching element detects a predetermined electric current, temperature, or the like, the protection circuit stops operation of the power semiconductor switching element and protects the power semiconductor switching element from destruction due to abnormality, such as overcurrent and overheat.

This protection circuit stops the operation of the power semiconductor switching element when detecting that some sort of abnormality has occurred in the chip of the power semiconductor switching element, and thereby the power semiconductor switching element can be prevented from chip destruction. However, in a system configured with the electric power converter device including the IPM, sudden stop of the electric power converter device can stop the entire system.

In order to prevent this sudden system stop, there is a known technology in which a protection circuit has a function for predicting occurrence of abnormality in the IPM and eliminates factors that cause the abnormal stop of the IPM before the sudden system stop occurs (for example, refer to Japanese Patent No. 3635988). According to this technology, the protection circuit outputs a precaution of a precursory sign of abnormality, before detecting abnormality of the power semiconductor switching element and outputting an alarm of the abnormality. Hence, the protection circuit has a function for detecting abnormality of the power semiconductor switching element, and the IPM outputs a precaution to the outside.

However, in the technology of Japanese Patent No. 3635988, the precaution and the alarm are digital signals of certain pulse widths that differ from each other, in order to make it possible to output the precaution and the alarm from a common terminal. In this case, software of a microcomputer of a receiver side usually determines which signal a measured pulse width means, and thus there is a problem that the processing takes a certain amount of time and lacks instantaneousness.

Also, a semiconductor device that uses a plurality of power semiconductor switching elements is normally provided with as many protection circuits as the power semiconductor switching elements, and each protection circuit corresponds to one power semiconductor switching element. In this case, each of the protection circuits is configured as an individual semiconductor integrated circuit (IC), and a wired OR (alarm line) of alarm output terminals of all the protection circuits is connected to the outside in many cases in order to reduce the number of terminals and lines. In the past semiconductor device connected in this way, each protection circuit monitors the level of the alarm line, and if an alarm is issued from another protection circuit, stops the power semiconductor switching element corresponding to the protection circuit for the purpose of safety of the entire semiconductor device. However, if not only the alarm but also the precaution, which is needless to immediately stop the semiconductor device, is output from the same terminal at the same level (voltage) as the alarm, there is a problem that it is difficult for each protection circuit to operate appropriately.

SUMMARY OF THE INVENTION

According to one aspect, there is provided a semiconductor device including: a power semiconductor switching element; and a control IC configured to drive the power semiconductor switching element, and to protect the power semiconductor switching element and output an alarm at a time of abnormality, wherein the control IC includes a gate control circuit configured to control the power semiconductor switching element, a protection alarm output circuit configured to output a protection operation signal to the gate control circuit and an alarm signal output terminal when the abnormality of the power semiconductor switching element is detected, and a precaution circuit configured to detect a precursory sign of the abnormality of the power semiconductor switching element and output to the alarm signal output terminal a precaution signal of a level that differs from the protection operation signal.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 2A illustrates an example of an external pull-up circuit, and FIG. 2B illustrates an exemplary variant of an external pull-up circuit;

DETAILED DESCRIPTION OF THE INVENTION

In the following, embodiments of the present disclosure will be described in detail with reference to the drawings, with regard to exemplary cases that employ an IPM that uses an IGBT as a power semiconductor switching element. Note that each embodiment can be carried out by combining a plurality of embodiments without inconsistency.

Figure 1:
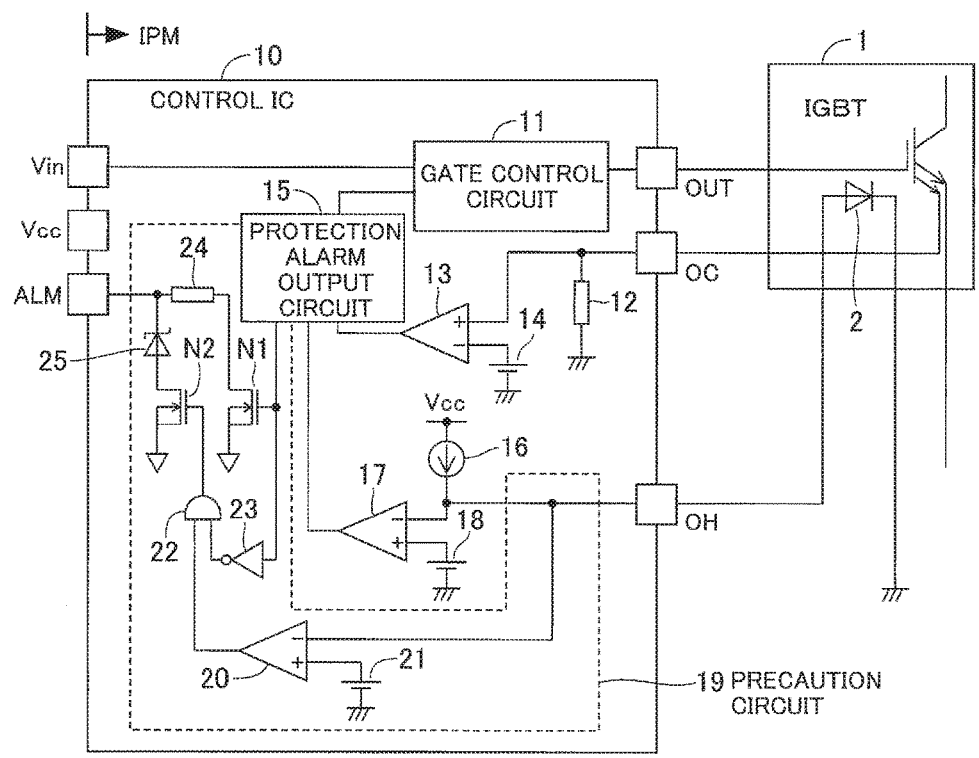
FIG. 1 is a circuit diagram illustrating one exemplary configuration of an IPM in which a semiconductor device according to a first embodiment is configured.
Figure 2A:
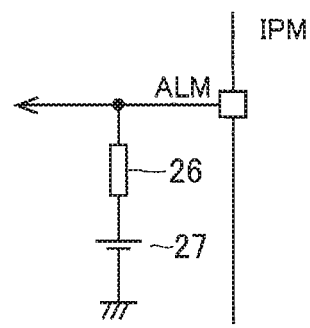
FIGS. 2A and 2B illustrate external pull-up circuits connected to an IPM, where
Figure 2B:
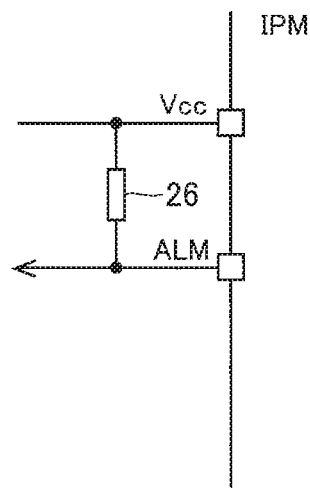
Figure 3:
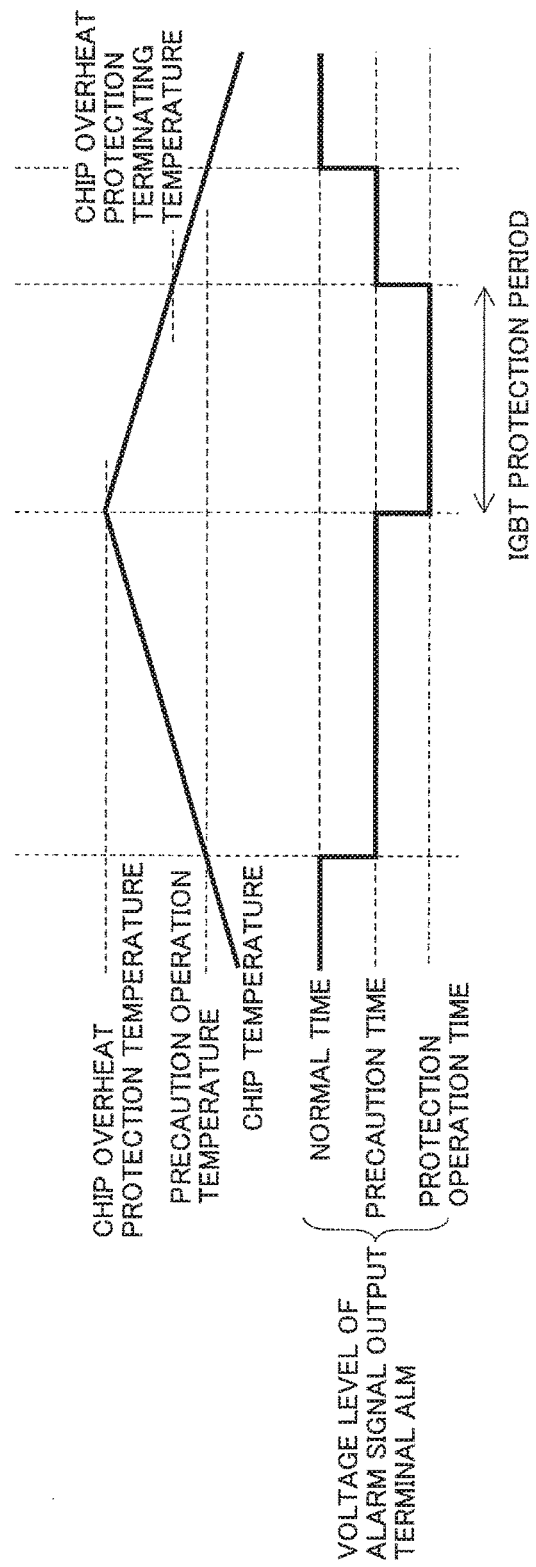
FIG. 3 is a timing chart of an alarm signal output to an alarm signal output terminal at the time of chip overheat precaution and protection operation.

FIG. 1 is a circuit diagram illustrating one exemplary configuration of an IPM in which a semiconductor device according to a first embodiment is configured. FIGS. 2A and 2B illustrate external pull-up circuits connected to the IPM, where FIG. 2A illustrates an example of an external pull-up circuit, and FIG. 2B illustrates an exemplary variant of the external pull-up circuit. FIG. 3 is a timing chart of an alarm signal output to an alarm signal output terminal at the time of chip overheat precaution and protection operation.

The semiconductor device according to the first embodiment includes an IGBT chip 1 and a control IC 10. Note that FIG. 1 illustrates a set of the IGBT chip 1 and the control IC 10, but in general one IPM includes a plurality of sets of IGBT chips 1 and control ICs 10.

The IGBT chip 1 includes a main semiconductor switching element through which main electric current flows and a current sense element that detects electric current of the main semiconductor switching element (in FIG. 1, the main semiconductor switching element and the current sense element are represented by one IGBT symbol, and only their emitter terminals are distinguished by illustrating two emitter terminals of the main semiconductor switching element and the current sense element), and a temperature detection diode 2 is formed on a surface of a chip. This temperature detection diode 2 serves to detect chip temperature of the main semiconductor switching element by monitoring temperature-dependent forward voltage.

The control IC 10 includes a control signal input terminal Vin, a gate signal output terminal OUT, an overcurrent detection terminal OC, an overheat detection terminal OH, a control power-supply voltage terminal Vcc (the voltage of this terminal is also represented by Vcc), and an alarm signal output terminal ALM.

A control signal for controlling and turning on and off the IGBT chip 1 is input into the control signal input terminal Vin from the outside of the IPM. The gate signal output terminal OUT is connected to a gate terminal of the IGBT chip 1, and the overcurrent detection terminal OC is connected to the emitter terminal of the current sense element of the IGBT chip 1, and the overheat detection terminal OH is connected to an anode terminal of the temperature detection diode 2. A cathode terminal of the temperature detection diode 2 is grounded. The alarm signal output terminal ALM outputs an alarm signal indicating abnormality in the IPM and precaution that signs the abnormality. Note that, in this embodiment, the IPM has an overheat protection function for the IGBT chip 1, but in other embodiments of the invention, the IPM has overcurrent protection, insufficient control voltage protection, and case overheat protection.

The control IC 10 includes a gate control circuit 11, and an input of the gate control circuit 11 is connected to the control signal input terminal Vin, and an output of the gate control circuit 11 is connected to the gate signal output terminal OUT. The overcurrent detection terminal OC of the control IC 10 is connected to one terminal of an overcurrent detection resistor 12 and a non-inverting input terminal of a comparator 13. Another terminal of the overcurrent detection resistor 12 is grounded. A positive terminal of a reference voltage supply 14 is connected to an inverting input terminal of the comparator 13, and a negative terminal of the reference voltage supply 14 is grounded. An output terminal of the comparator 13 is connected to an overcurrent detection input of a protection alarm output circuit 15.

Thereby, the electric current that flows in the current sense element flows in the overcurrent detection resistor 12, in proportion to the main electric current that flows in the main semiconductor switching element of the IGBT chip 1, and then a voltage drop by the overcurrent detection resistor 12 is applied to the comparator 13. When the voltage drop by the overcurrent detection resistor 12 is smaller than the voltage of the reference voltage supply 14, the comparator 13 outputs a low (L) level signal to the protection alarm output circuit 15. When overcurrent flow makes the voltage drop by the overcurrent detection resistor 12 larger than the voltage of the reference voltage supply 14, the comparator 13 outputs a high (H) level signal to the protection alarm output circuit 15. In this case, the protection alarm output circuit 15 outputs a signal for turning off the IGBT chip 1 to the gate control circuit 11, in order to prevent chip destruction of the IGBT chip 1.

One terminal of a constant current source 16 is connected to the control power-supply voltage terminal Vcc, and another terminal of the constant current source 16 is connected to the overheat detection terminal OH of the control IC 10. Also, the overheat detection terminal OH of the control IC 10 is connected to an inverting input terminal of a comparator 17. A non-inverting input terminal of the comparator 17 is connected to a positive terminal of a reference voltage supply 18, and a negative terminal of the reference voltage supply 18 is grounded. An output terminal of the comparator 17 is connected to an overheat detection input of the protection alarm output circuit 15.

Thereby, the constant current source 16 causes a constant electric current to flow in the temperature detection diode 2, and voltage according to the chip temperature of the IGBT chip 1 is supplied to the overheat detection terminal OH. The voltage according to this chip temperature (which becomes lower as the chip temperature is higher) is compared with the voltage of the reference voltage supply 18 corresponding to chip overheat protection temperature of the comparator 17. When the chip temperature is low, and the voltage according to the temperature is greater than the voltage of the reference voltage supply 18, the comparator 17 outputs a low level signal to the protection alarm output circuit 15. When the chip temperature reaches the chip overheat protection temperature, the comparator 17 outputs a high level signal to the protection alarm output circuit 15. In this case, the protection alarm output circuit 15 outputs a signal for turning off the IGBT chip 1 to the gate control circuit 11, in order to prevent chip destruction of the IGBT chip 1.

Also, the overheat detection terminal OH of the control IC 10 is connected to a precaution circuit 19 that extends the overheat protection function. The precaution circuit 19 includes a comparator 20, and an inverting input terminal of the comparator 20 is connected to the overheat detection terminal OH, and a non-inverting input terminal of the comparator 20 is connected to a positive terminal of a reference voltage supply 21, and a negative terminal of the reference voltage supply 21 is grounded. An output terminal of the comparator 20 is connected to one input terminal of an AND circuit 22. Another input terminal of the AND circuit 22 is connected to an alarm output of the protection alarm output circuit 15 via a NOT circuit 23. Also, the alarm output of the protection alarm output circuit 15 is connected to a gate terminal of a transistor N1 which is a switch element.

A drain terminal of the transistor N1 is connected to the alarm signal output terminal ALM via a resistor 24, and a source terminal of the transistor N1 is grounded. An output terminal of the AND circuit 22 is connected to a gate terminal of a transistor N2 which is a switch element, and a drain terminal of the transistor N2 is connected to an anode terminal of a Zener diode 25, and a cathode terminal of the Zener diode 25 is connected to the alarm signal output terminal ALM. A source terminal of the transistor N2 is grounded. Note that, in this precaution circuit 19, the AND circuit 22, the NOT circuit 23, the resistor 24, the Zener diode 25, and the transistors N1 and N2 compose a multi-level generation circuit.

This precaution circuit 19 has a function for reporting to the outside in advance that there is a precursory sign of the chip temperature reaching the chip overheat protection temperature, when the chip temperature reaches a predetermined precaution operation temperature that is lower than the chip overheat protection temperature.

Note that, in this embodiment, a pull-up circuit that is needed to operate the precaution circuit 19 is not provided internally, and therefore an external pull-up circuit is needed to be connected to the alarm signal output terminal ALM at the outside of the IPM. This external pull-up circuit is configured such that a pull-up resistor 26 and a pull-up voltage supply 27 are connected in series and connected to the alarm signal output terminal ALM, as illustrated in FIG. 2A, for example. That is, one end of the pull-up resistor 26 is connected to the alarm signal output terminal ALM, and another end of the pull-up resistor 26 is connected to a positive terminal of the pull-up voltage supply 27, and a negative terminal of the pull-up voltage supply 27 is grounded. Thereby, the voltage of the pull-up voltage supply 27 is always applied to the alarm signal output terminal ALM via the pull-up resistor 26.

Also, the external pull-up circuit can be configured by connecting the pull-up resistor 26 between the control power-supply voltage terminal Vcc and the alarm signal output terminal ALM at the outside of the IPM, as illustrated in FIG. 2B. In this case, the voltage of the control power-supply voltage terminal Vcc is always applied to the alarm signal output terminal ALM via the pull-up resistor 26.

Next, operation at the time of chip overheat in the IPM of the above configuration will be described with reference to FIG. 3. The graph of the upper side of FIG. 3 illustrates change of chip temperature. Characteristics of forward voltage of the temperature detection diode 2 at the overheat detection terminal OH of the control IC 10 has an inverted shape of this graph in which the graph is turned upside down in the vertical direction, when the chip temperature changes while the constant electric current of the constant current source 16 flows in the temperature detection diode 2.

First, at a normal time when the chip temperature does not reach the precaution operation temperature, the voltage of the overheat detection terminal OH is higher than the reference voltage supply 21 of the comparator 20. In this case, both of the comparator 17 and the comparator 20 output low level signals. The protection alarm output circuit 15 outputs a low level signal to the gate terminal of the transistor N1 and the input terminal of the NOT circuit 23, when receiving the low level signal from the comparator 17. Hence, the transistor N1 that receives the low level signal at the gate terminal is turned off. Also, the low level signal output from the protection alarm output circuit 15 is logically inverted by the NOT circuit 23 into a high level signal and is input into the AND circuit 22. Hence, the AND circuit 22 receives the low level signal from the comparator 20 and receives the high level signal from the NOT circuit 23, and therefore outputs a low level signal. Thereby, the transistor N2, which receives the low level signal at the gate terminal, is also turned off.

Thus, at a normal time when the chip temperature does not reach the precaution operation temperature, the transistors N1 and N2 are turned off, and high level voltage pulled up by the external pull-up circuit is output to the alarm signal output terminal ALM. This high level voltage is equal to the voltage of the pull-up voltage supply 27 when the external pull-up circuit is the circuit illustrated in FIG. 2A, and is equal to the voltage of the control power-supply voltage terminal Vcc when the external pull-up circuit is the circuit illustrated in FIG. 2B. Also, in the timing chart illustrated in FIG. 3, this high level voltage is equal to the voltage of the level indicated by "normal time".

Next, at the time of precaution when the chip temperature exceeds the precaution operation temperature, the voltage of the overheat detection terminal OH decreases to a voltage lower than the reference voltage supply 21 of the comparator 20. In this case, the comparator 17 continues outputting a low level signal, and the comparator 20 outputs a high level signal. The protection alarm output circuit 15 continuously receives the low level signal from the comparator 17, and thus outputs a low level signal to the gate terminal of the transistor N1 and the input terminal of the NOT circuit 23. Hence, the transistor N1 receives the low level signal at the gate terminal and is turned off. Also, the low level signal output from the protection alarm output circuit 15 is logically inverted by the NOT circuit 23 into a high level signal and is input into the AND circuit 22. The AND circuit 22 receives the high level signals from the NOT circuit 23 and the comparator 20 and therefore outputs a high level signal. Thereby, the transistor N2 receives the high level signal at the gate terminal and is turned on.

Thus, at the time of precaution when the chip temperature exceeds the precaution operation temperature, the transistor N1 is turned off, and the transistor N2 is turned on, and thus the Zener voltage of the Zener diode 25 is supplied to the alarm signal output terminal ALM. This Zener voltage is an intermediate level voltage between the voltage output to the alarm signal output terminal ALM at a normal time and the ground voltage. This intermediate level voltage is equal to the voltage of the level indicated by "precaution time" in the timing chart illustrated in FIG. 3.

Further, at the time of protection operation when the chip temperature rises and reaches the chip overheat protection temperature, the voltage of the overheat detection terminal OH further decreases and reaches the voltage of the reference voltage supply 18 of the comparator 17. In this case, both of the comparator 17 and the comparator 20 output high level signals. When receiving the high level signal from the comparator 17, the protection alarm output circuit 15 outputs a high level signal to the gate terminal of the transistor N1 and the input terminal of the NOT circuit 23, as well as outputs a signal for turning off the IGBT chip 1 to the gate control circuit 11 in order to prevent chip destruction of the IGBT chip 1. The high level signal output from the protection alarm output circuit 15 is supplied to the gate terminal of the transistor N1 in order to turn on the transistor N1. Also, the high level signal output from the protection alarm output circuit 15 is logically inverted by the NOT circuit 23 into a low level signal and is input into the AND circuit 22. Hence, the AND circuit 22 receives the low level signal from the NOT circuit 23 and receives the high level signal from the comparator 20, and therefore outputs a low level signal. Thereby, the transistor N2 receives the low level signal at the gate terminal and is turned off.

Thus, at the time of protection operation when the chip temperature reaches the chip overheat protection temperature, only the transistor N1 is turned on, and therefore the pull-up resistor 26 of the external pull-up circuit and the resistor 24 are connected in series to the alarm signal output terminal ALM. Here, the resistor 24 is set at a sufficiently smaller value than the pull-up resistor 26, and thus voltage of a level that is lower than the Zener voltage of the Zener diode 25 is supplied to the alarm signal output terminal ALM. When the external pull-up circuit is the circuit illustrated in FIG. 2A, this low level voltage is equal to the voltage that is obtained by dividing the voltage of the pull-up voltage supply 27 by a voltage division ratio of the pull-up resistor 26 and the resistor 24. Also, when the external pull-up circuit is the circuit illustrated in FIG. 2B, this low level voltage is equal to the voltage that is obtained by dividing the voltage of the control power-supply voltage terminal Vcc by a voltage division ratio of the pull-up resistor 26 and the resistor 24. Note that, in the timing chart illustrated in FIG. 3, this low level voltage is equal to the voltage of the level indicated by "protection operation time".

As described above, when the chip temperature rises, a precaution is issued before the chip temperature reaches the chip overheat protection temperature, and therefore some sort of prevention measure can be taken to prevent chip destruction by the time the chip temperature reaches the chip overheat protection temperature. Note that, when the chip temperature actually reaches the chip overheat protection temperature, the IGBT chip 1 is turned off for protection, and thereafter the chip temperature gradually decreases to chip overheat protection terminating temperature, and the alarm signal of the alarm signal output terminal ALM becomes the intermediate level voltage. When the chip temperature further decreases to a temperature below the precaution operation temperature, the alarm signal of the alarm signal output terminal ALM becomes the low level voltage of the normal time.

Note that, in the first embodiment, the voltage may be pulled up inside the control IC 10, without providing the external pull-up circuit. For example, if a constant current source is connected to the drain terminal of the transistor N1 as a pull-up element, the alarm signal of the alarm signal output terminal ALM at a normal time when both of the transistors N1 and N2 are turned off is the power supply voltage Vcc of the constant current source (i.e., the power supply voltage of the control IC 10), and the alarm signal at the time of precaution when only the transistor N2 is turned on is the Zener voltage of the Zener diode 25, and the alarm signal at the time of protection operation when the transistor N1 is turned on is the ground potential.

Figure 4:
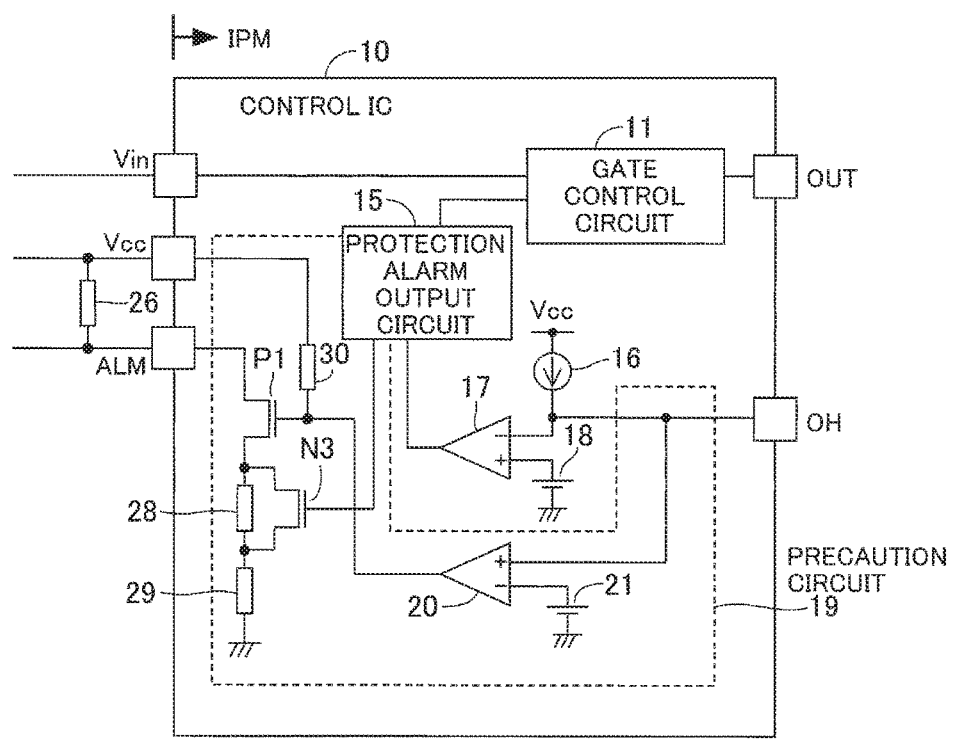
FIG. 4 is a circuit diagram illustrating one exemplary configuration of an IPM in which a semiconductor device according to a second embodiment is configured.

FIG. 4 is a circuit diagram illustrating one exemplary configuration of the IPM in which the semiconductor device according to a second embodiment is configured. Note that, in FIG. 4, the same or equivalent components as the components illustrated in FIG. 1 are denoted with the same reference signs and their detailed description will be omitted. Also, in this FIG. 4, the part of the overcurrent protection function and the IGBT chip 1 are omitted (likewise in the following).

In the semiconductor device according to the second embodiment, the configuration of the precaution circuit 19 is changed from the semiconductor device according to the first embodiment. That is, in this precaution circuit 19, a series circuit of a transistor P1 and resistors 28 and 29 is connected between the alarm signal output terminal ALM and the ground, and a transistor N3 is connected in parallel with the resistor 28. The output of the protection alarm output circuit 15 is connected to a gate terminal of this transistor N3, and the control power-supply voltage terminal Vcc is connected to a gate terminal of the transistor P1 via a resistor 30, and the output terminal of the comparator 20 is connected to the gate terminal of the transistor P1. Here, the resistor 30 serves to pull up the output terminal of the comparator 20 when the output terminal of the comparator 20 is an open collector or an open emitter, and a connection circuit that uses the resistor 30 that connects between the control power-supply voltage terminal Vcc and the gate terminal of the transistor P1 may be omitted when the output terminal of the comparator 20 is not an open collector or an open emitter (likewise in the following). Note that, in this embodiment, the non-inverting input terminal of the comparator 20 is connected to the overheat detection terminal OH, and the inverting input terminal of the comparator 20 is connected to the reference voltage supply 21. Also, the external pull-up circuit employs the configuration illustrated in FIG. 2B.

In the precaution circuit 19 of the above configuration, the comparator 17 outputs a low level signal, and the comparator 20 outputs a high level signal, at a normal time when the chip temperature does not reach the precaution operation temperature. In this case, the protection alarm output circuit 15 outputs a low level signal to a gate terminal of the transistor N3, and thus the transistor N3 is turned off. On the other hand, the transistor P1 receives the high level output signal of the comparator 20 and is turned off. Thereby, the precaution circuit 19 outputs high level voltage to the alarm signal output terminal ALM. In this case, the high level voltage is equal to the voltage Vcc applied to the control power-supply voltage terminal Vcc.

Next, at the time of precaution when the chip temperature exceeds the precaution operation temperature, the comparator 17 continues outputting a low level signal, and the voltage input into the non-inverting input terminal of the comparator 20 becomes lower than the reference voltage supply 21, and thus the comparator 20 outputs a low level signal. In this case, the protection alarm output circuit 15 continuously outputs the low level signal to the gate terminal of the transistor N3, and the transistor N3 remains turned off. On the other hand, the transistor P1 is turned on by the low level signal output from the comparator 20. Thereby, the precaution circuit 19 outputs intermediate level voltage to the alarm signal output terminal ALM. In this case, the intermediate level voltage is equal to the voltage obtained by dividing the voltage applied to the control power-supply voltage terminal Vcc by a voltage division ratio of the pull-up resistor 26 and the resistors 28 and 29.

Next, at the time of protection operation when the chip temperature reaches the chip overheat protection temperature, the comparator 17 outputs a high level signal, and the comparator 20 outputs a low level signal. When receiving the high level signal from the comparator 17, the protection alarm output circuit 15 outputs a high level signal to the gate terminal of the transistor N3, as well as outputs a signal for turning off the IGBT chip 1 to the gate control circuit 11 in order to prevent chip destruction of the IGBT chip 1. The high level signal output from the protection alarm output circuit 15 turns on the transistor N3 and shorts both ends of the resistor 28. On the other hand, the low level signal output from the comparator 20 keeps the transistor P1 to be turned on. Thereby, the precaution circuit 19 outputs a low level voltage to the alarm signal output terminal ALM. In this case, the low level voltage is equal to the voltage obtained by dividing the voltage applied to the control power-supply voltage terminal Vcc by a voltage division ratio of the pull-up resistor 26 and the resistor 29.

Note that, in this second embodiment, the transistor N3 is connected in parallel with the resistor 28, among the resistors 28 and 29 connected in series, but the transistor N3 may be connected in parallel with the resistor 29.

Figure 5:
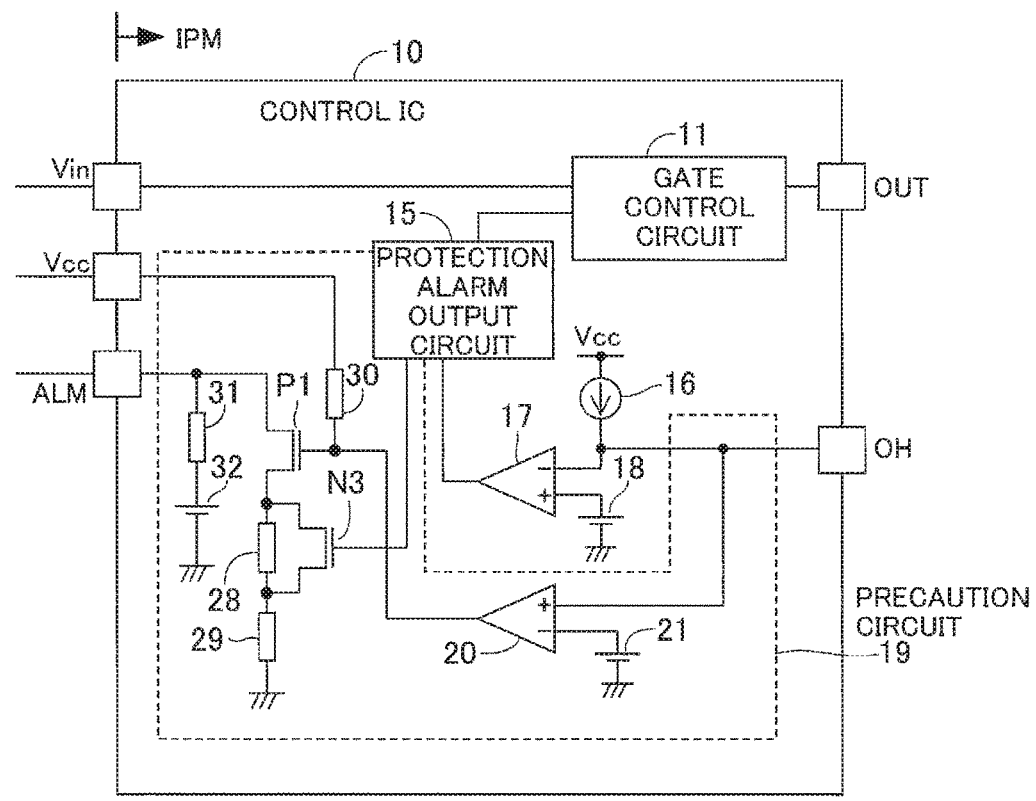
FIG. 5 is a circuit diagram illustrating one exemplary configuration of an IPM in which a semiconductor device according to a third embodiment is configured.

FIG. 5 is a circuit diagram illustrating one exemplary configuration of the IPM in which the semiconductor device according to a third embodiment is configured. Note that, in FIG. 5, the same or equivalent components as the components illustrated in FIG. 4 are denoted with the same reference signs and their detailed description will be omitted.

In the semiconductor device according to the third embodiment, the precaution circuit 19 does not need the external pull-up circuit. That is, the precaution circuit 19 includes a series circuit of a pull-up resistor 31 and a pull-up voltage supply 32, and this series circuit is connected between the alarm signal output terminal ALM and the ground. Thereby, the precaution circuit 19 can pull up the alarm signal output terminal ALM by the internal pull-up voltage supply 32. Other components are the same as the semiconductor device according to the second embodiment, and thus the effect is also the same.

Figure 6:
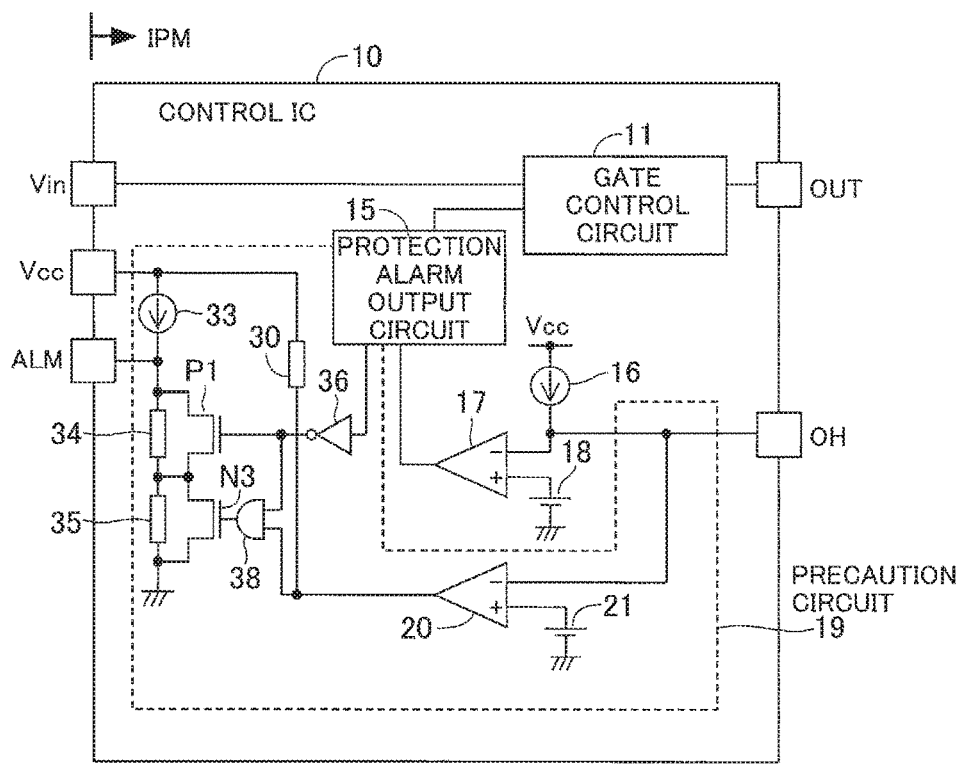
FIG. 6 is a circuit diagram illustrating one exemplary configuration of an IPM in which a semiconductor device according to a fourth embodiment is configured.

FIG. 6 is a circuit diagram illustrating one exemplary configuration of the IPM in which the semiconductor device according to a fourth embodiment is configured. Note that, in FIG. 6, the same or equivalent components as the components illustrated in FIG. 4 are denoted with the same reference signs and their detailed description will be omitted.

In the semiconductor device according to the fourth embodiment, the precaution circuit 19 is configured such that a circuit for generating voltages of three levels is composed of a constant current source 33, resistors 30, 34, and 35, transistors P1 and N3, a NOT circuit 36, and an AND circuit 38. That is, the constant current source 33 and the resistors 34 and 35 that are connected in series are connected between the control power-supply voltage terminal Vcc and the ground, and a connection point between the constant current source 33 and the resistor 34 is connected to the alarm signal output terminal ALM. Further, the transistors P1 and N3 are connected to the resistors 34 and in parallel with the resistors 34 and 35. The gate terminal of the transistor P1 is connected to the output of the protection alarm output circuit 15 via the NOT circuit 36, and the gate terminal of the transistor N3 is connected to an output terminal of the AND circuit 38. One input terminal of the AND circuit 38 is connected to an output terminal of the NOT circuit 36, and another input terminal of the AND circuit 38 is connected to the output terminal of the comparator 20. One end of the resistor 30 is connected to the control power-supply voltage terminal Vcc, and another end of the resistor 30 is connected to the output terminal of the comparator 20. Note that, in this embodiment, the inverting input terminal of the comparator 20 is connected to the overheat detection terminal OH, and the non-inverting input terminal of the comparator 20 is connected to the reference voltage supply 21. Also, with regard to the resistors 34 and 35, the resistance value of the resistor 34 is set higher than the resistance value of the resistor 35.

In the precaution circuit 19 of the above configuration, both of the comparator 17 and the comparator 20 output low level signals at a normal time when the chip temperature does not reach the precaution operation temperature. In this case, the protection alarm output circuit 15 outputs a low level signal to the input terminal of the NOT circuit 36, and therefore a high level signal logically inverted by the NOT circuit 36 is supplied to the gate terminal of the transistor P1 and one input terminal of the AND circuit 38. Hence, the transistor P1 is turned off. On the other hand, the AND circuit 38 receives the low level signal from the comparator 20, and thus supplies a low level signal to the gate terminal of the transistor N3 in order to turn off the transistor N3. Both of the transistors P1 and N3 are turned off, and thus high level voltage is output to the alarm signal output terminal ALM. This high level voltage is equal to the voltage that is generated by the constant electric current flowing from the constant current source 33 through the resistors 34 and 35 connected in series.

Next, the comparator 17 continues outputting the low level signal, and the comparator 20 outputs a high level signal, at the time of precaution when the chip temperature exceeds the precaution operation temperature. In this case, the protection alarm output circuit 15 continuously outputs the low level signal to the input terminal of the NOT circuit 36, and therefore the transistor P1 remains turned off. On the other hand, the output of the comparator 20 becomes a high level signal, and thus the high level signal is input into both the input terminals of the AND circuit 38, and the AND circuit 38 outputs a high level signal in order to turn on the transistor N3. Thereby, the resistor 35, which is one of the serially connected resistors 34 and 35, is shorted by the transistor N3, and consequently an intermediate level voltage is output to the alarm signal output terminal ALM. This intermediate level voltage is equal to the voltage that is generated by the constant electric current flowing from the constant current source 33 through the resistor 34.

Next, both of the comparator 17 and the comparator 20 output high level signals at the time of protection operation when the chip temperature reaches the chip overheat protection temperature. When receiving the high level signal from the comparator 17, the protection alarm output circuit 15 outputs a high level signal to the input terminal of the NOT circuit 36, as well as outputs a signal for turning off the IGBT chip 1 to the gate control circuit 11 in order to prevent chip destruction of the IGBT chip 1. The high level signal output from the protection alarm output circuit 15 is logically inverted by the NOT circuit 36 into a low level signal, and thereby turns on the transistor P1 and shorts both the ends of the resistor 34. On the other hand, one of the input terminals of the AND circuit 38 becomes a low level, and thus the AND circuit 38 outputs a low level signal to the gate terminal of the transistor N3 in order to turn off the transistor N3. Thereby, the resistor 34, which is one of the serially connected resistors 34 and 35, is shorted by the transistor P1, and consequently a low level voltage is output to the alarm signal output terminal ALM. This low level voltage is equal to the voltage that is generated by the constant electric current flowing from the constant current source 33 through the resistor 35 that has a smaller resistance value than the resistor 34.

As described above, in this embodiment, the high level voltage is output to the alarm signal output terminal ALM at the time of normal operation of the IPM, and the intermediate level voltage is output to the alarm signal output terminal ALM at the time of precaution, and the low level voltage is output to the alarm signal output terminal ALM at the time of protection operation.

Note that, in this embodiment, both ends of the resistors 34 and 35 are connected or opened by the transistors P1 and N3, and the transistors P1 and N3 are exclusively controlled in such a manner that the transistors P1 and N3 are not turned on simultaneously. When the exclusive control is not needed, the output terminal of the comparator 20 may be directly connected to the gate terminal of the transistor N3. In this case, both of the transistors P1 and N1 are turned on at the time of protection operation, and the electric potential of the alarm signal output terminal ALM becomes the ground potential.

Figure 7:
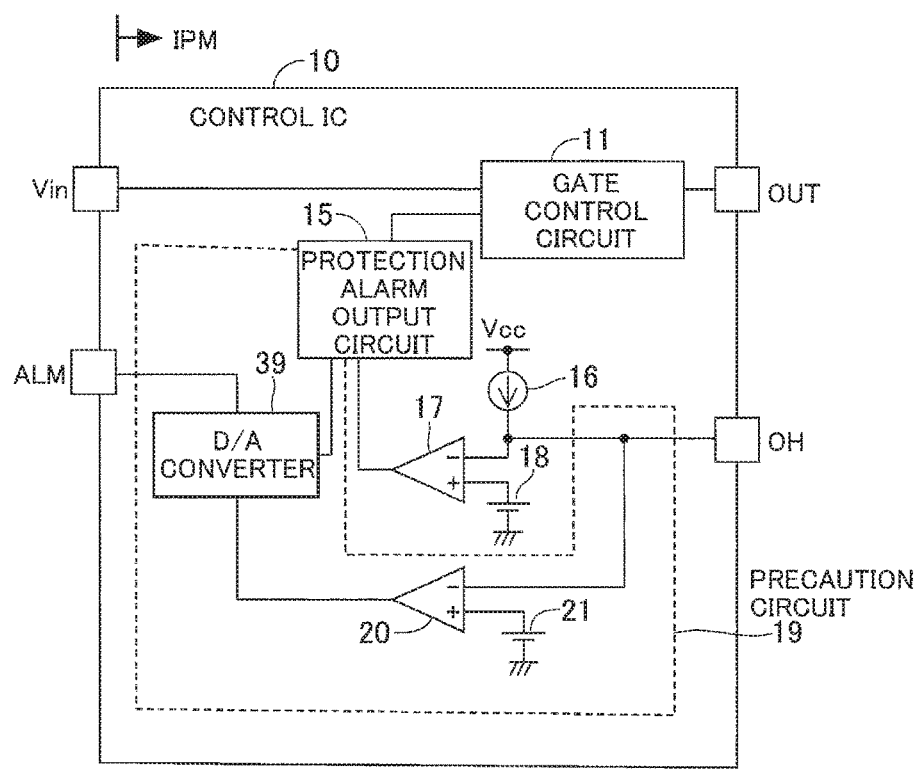
FIG. 7 is a circuit diagram illustrating one exemplary configuration of an IPM in which a semiconductor device according to a fifth embodiment is configured.

FIG. 7 is a circuit diagram illustrating one exemplary configuration of the IPM in which the semiconductor device according to a fifth embodiment is configured. Note that, in FIG. 7, the same or equivalent components as the components illustrated in FIG. 6 are denoted with the same reference signs and their detailed description will be omitted.

In the semiconductor device according to the fifth embodiment, the precaution circuit 19 generates voltage signals of three levels by a digital to analog converter (D/A converter) 39. That is, this D/A converter 39 receives, as inputs, binary logic signals from the protection alarm output circuit 15 and the comparator 20, and generates voltage a signal of three levels on the basis of these logic signals, and outputs the voltage signal to the alarm signal output terminal ALM. In this case, the voltage signal of the lowest level among the three levels can be set at the ground potential.

Figure 8:
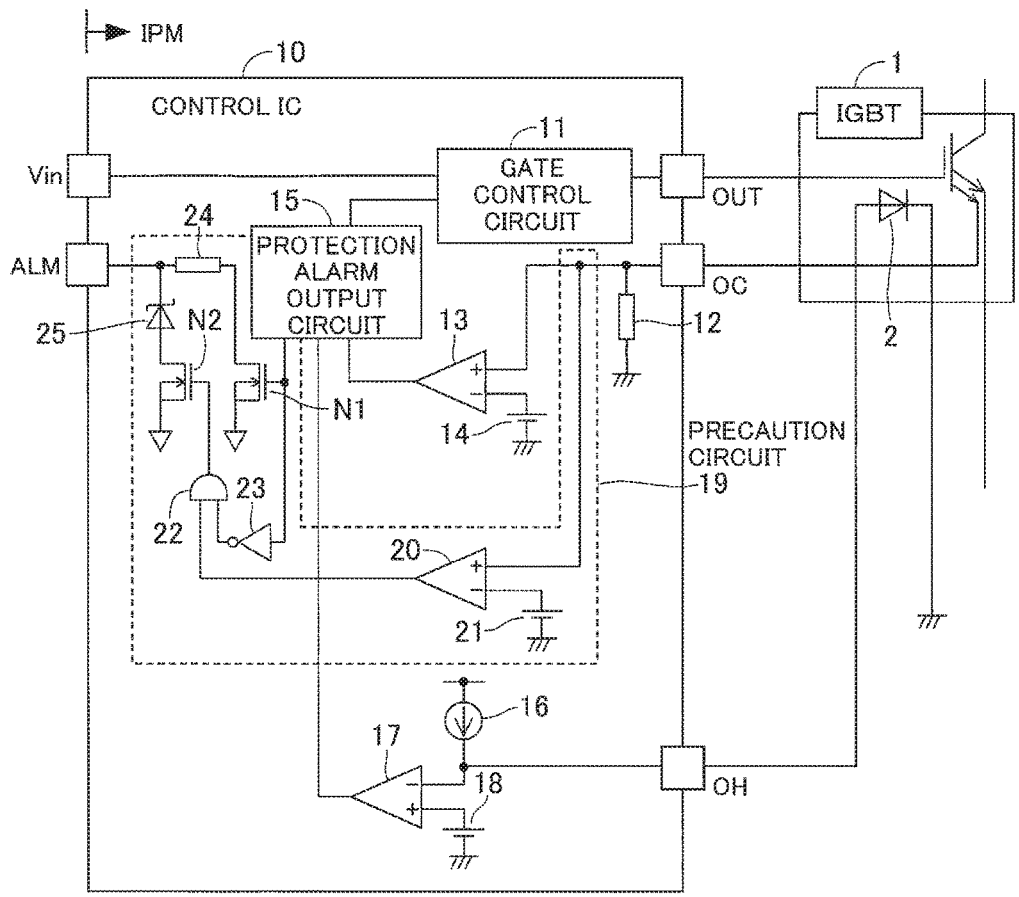
FIG. 8 is a circuit diagram illustrating one exemplary configuration of an IPM in which a semiconductor device according to a sixth embodiment is configured.

FIG. 8 is a circuit diagram illustrating one exemplary configuration of the IPM in which the semiconductor device according to a sixth embodiment is configured. Note that, in FIG. 8, the same or equivalent components as the components illustrated in FIG. 1 are denoted with the same reference signs and their detailed description will be omitted.

In the semiconductor device according to the sixth embodiment, the precaution circuit 19 serves as the overcurrent detection circuit. This precaution circuit 19 has the same circuit configuration as FIG. 1, and the input terminal of the comparator 20 is not connected to the overheat detection terminal OH, but to the overcurrent detection terminal OC. Also, the non-inverting input terminal of the comparator 20 is connected to the overcurrent detection terminal OC in the same way as the comparator 13, and the inverting input terminal is connected to the reference voltage supply 21.

The precaution circuit 19 in the sixth embodiment outputs voltage signals of three levels to the alarm signal output terminal ALM in accordance with chip current, in the same way as the first embodiment. That is, a high level voltage signal is output at a normal time when the chip current does not reach precaution operation electric current. The intermediate level voltage signal is output at the time of precaution when the chip current exceeds the precaution operation electric current, and the low level voltage signal is output at the time of protection operation when the chip current reaches chip overcurrent protection electric current.

Note that the precaution circuit 19 that issues a precaution of the overcurrent of chip current has been described in this embodiment, but such a precaution circuit 19 can be used together with the precaution circuit 19 that issues a precaution of the overheat of chip temperature in the first to fifth embodiments. In this case, the alarm signal can be four level voltage signals to distinguish the precaution of overcurrent and the precaution of overheat. Further, the precaution circuit 19 can be configured to issue a precaution of an abnormal decrease of the control power supply voltage, in addition to the detection and precaution of the chip overheat and the overcurrent.

Figure 9:
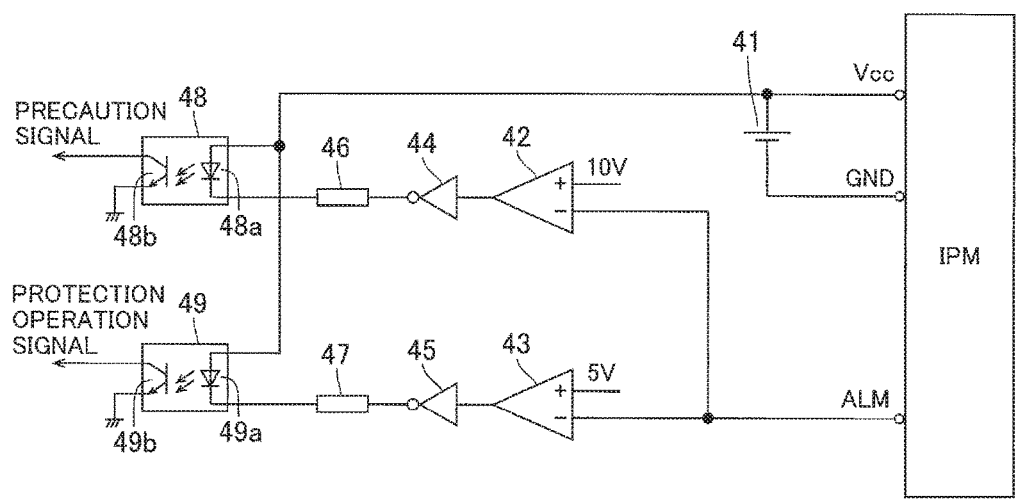
FIG. 9 is a circuit diagram illustrating one exemplary configuration of an identification circuit that identifies an output alarm signal.
Figure 10:
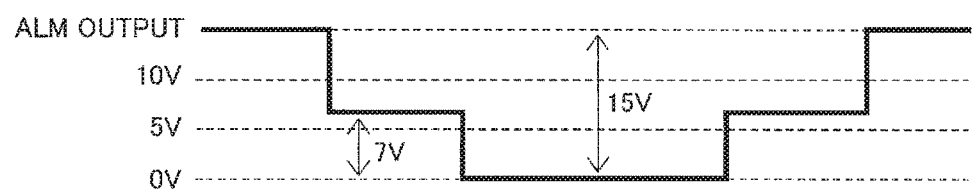
FIG. 10 illustrates a relationship between an alarm signal output from an alarm signal output terminal and identification threshold values.

FIG. 9 is a circuit diagram illustrating one exemplary configuration of an identification circuit that identifies an output alarm signal, and FIG. 10 is a diagram for describing a relationship between an alarm signal output from an alarm signal output terminal and identification threshold values.

The IPM outputs an alarm signal, which can be any one of a plurality of levels of voltage signals, from the alarm signal output terminal ALM of the IPM, and when the alarm signal is reported to a higher-class control device, the identification circuit identifies the level of the alarm signal and separates the alarm signal into a precaution signal and a protection operation signal and outputs the precaution signal and the protection operation signal.

A control power-supply voltage supply 41 that supplies control power supply voltage to the control IC 10 of the IPM is connected between the control power-supply voltage terminal Vcc and the ground terminal GND in the identification circuit illustrated in FIG. 9. The alarm signal output terminal ALM is connected to inverting input terminals of comparators 42 and 43, and threshold value voltages of reference voltage supplies are applied to non-inverting input terminals of the comparators 42 and 43. In this embodiment, the threshold value of the comparator 42 is 10 volts, and the threshold value of the comparator 43 is 5 volts.

Outputs of the comparators 42 and 43 are connected to photo couplers 48 and 49 via NOT circuits 44 and 45 and resistors 46 and 47, respectively. The photo couplers 48 and 49 include light emitting diodes 48a and 49a and photo transistors 48b and 49b. Anode terminals of the light emitting diodes 48a and 49a are connected to the control power-supply voltage terminal Vcc, and cathode terminals of the light emitting diodes 48a and 49a are connected to the resistors 46 and 47. Collector terminals of the photo transistors 48b and 49b are connected to a higher-class control device, and emitter terminals of the photo transistors 48b and 49b are connected to a frame ground.

Here, with regard to the alarm signal output from the alarm signal output terminal ALM of the IPM, the voltage output at a normal time is 15 volts, and the voltage output at the time of precaution is 7 volts, and the voltage output at the time of protection operation is 0 volt, as illustrated in FIG. 10.

First, when the voltage of 15 volts is output from the alarm signal output terminal ALM at a normal time, both of the comparators 42 and 43 receive the voltage that exceeds their threshold values at the inverting input terminals, and thus output low level signals. These low level signals are converted to high level signals at the NOT circuits 44 and 45 and are applied to the cathode terminals of the light emitting diodes 48a and 49a of the photo couplers 48 and 49 via the resistors 46 and 47. Thereby, electric current does not flow in the light emitting diodes 48a and 49a, and thus the light emitting diodes 48a and 49a do not emit light, and the photo transistors 48b and 49b remain turned off.

Next, when the voltage of the alarm signal decreases and becomes lower than 10 volts which is the threshold value of the comparator 42, the comparator 42 outputs a high level signal, and the output of the comparator 43 remains low level. The output signal of the comparator 42 is inverted, and thereby the output of the NOT circuit 44 is turned into a low level, so that electric current flows through the light emitting diode 48a, and the light emitting diode 48a emits light. As a result, the photo transistor 48b switches to an ON state, while the photo transistor 49b continues to be turned off. The photo coupler 48 outputs a precaution signal, as the photo transistor 48b is turned on.

Further, when the voltage of the alarm signal decreases and becomes lower than 5 volts which is the threshold value of the comparator 43, the comparator 43 also outputs a high level signal, and the NOT circuit 45 logically inverts the high level signal and outputs a low level signal. Thereby, electric current flows through the light emitting diode 49a of the photo coupler 49, and the light emitting diode 49a emits light, so that the photo transistor 49b is turned on to output a protection operation signal. In this case, the photo transistor 48b remains turned on, and thus the photo coupler 48 outputs the precaution signal simultaneously.

As described above, when the level of the alarm signal output from the alarm signal output terminal ALM changes, and the output voltage is higher than 10 volts, the precaution signal and the protection operation signal are not output. When the output voltage is 5 to 10 volts, only the precaution signal is output, and when the output voltage is lower than 5 volts, both of the precaution signal and the protection operation signal are output. As described above, even if a plurality of levels of voltages are output from the single alarm signal output terminal ALM, the identification circuit illustrated in FIG. 9 can selectively output the precaution signal and the protection operation signal.

Also, the precaution is output before the protection operation is performed, in order to prompt elimination of a factor of abnormal stop after the precaution is issued and before the protection operation is executed. Thereby, the system is prevented from sudden stop.

Further, this identification circuit identifies the voltage level of the alarm signal by means of the comparators 42 and 43, but the identification circuit is not limited thereto and may identify the voltage level of the alarm signal by utilizing Zener diodes that differ in breakdown voltage, for example.

Note that, in the above embodiments, the transistors N1, N2, and N3 are assumed to be N-channel MOS transistors, and the transistor P1 is assumed to be a P-channel MOS transistor.

The semiconductor device of the above configuration outputs different voltage levels to the alarm signal output terminal, depending on precaution time and protection operation time, and thereby has the advantage of being superior in instantaneousness by reporting the precaution and the protection operation at a single terminal. Also, in a semiconductor device that includes a plurality of power semiconductor switching elements, a protection circuit receives a precaution at the time of precaution and determines that it is needless to turn off its own power semiconductor switching element immediately, and therefore has the advantage of flexibly operating such a semiconductor device including a plurality of power semiconductor switching elements.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device comprising:
a power semiconductor switching element; and
a control IC configured to drive the power semiconductor switching element, and to detect abnormality of the power semiconductor switching element, to generate a protection signal when abnormality is detected and to protect the power semiconductor switching element and output an alarm at a time of the abnormality,
wherein the control IC includes
a gate control circuit configured to receive the generated protection signal when the abnormality of the power semiconductor switching element is detected, and in response thereto, control the power semiconductor switching element, the control IC being configured to
output an abnormality signal to an alarm signal output terminal of the control IC as said alarm when the abnormality of the power semiconductor switching element is detected,
detect a precursory sign of the abnormality of the power semiconductor switching element, and
output, as the alarm, to the alarm signal output terminal a precaution signal of a voltage level that differs from a voltage level of said abnormality signal.

2. The semiconductor device according to claim 1, wherein the control IC further includes a protection alarm output circuit and a precaution circuit that includes:
a comparator having a threshold value that differs from a threshold value for detecting the abnormality of the power semiconductor switching element; and
a multilevel generation circuit configured to generate a signal of a different level depending on operating in a normal mode, a precaution mode, or a protection operation mode, on the basis of a first signal output from the protection alarm output circuit and a second signal output from the comparator, and output the generated signal to the alarm signal output terminal.

3. The semiconductor device according to claim 2, wherein
the multilevel generation circuit includes:
a first series circuit of a resistor and a first switch element that are connected between the alarm signal output terminal and a ground,
a second series circuit of a Zener diode and a second switch element that are connected between the alarm signal output terminal and the ground,
a NOT circuit configured to logically invert the first signal, and
an AND circuit configured to receive the second signal and an output signal of the NOT circuit,
wherein the multilevel generation circuit controls the first switch element on the basis of the first signal, and the second switch element on the basis of an output signal of the AND circuit.

4. The semiconductor device according to claim 2,
wherein the multilevel generation circuit includes:
  a series circuit of a first switch element, a first resistor, and a second resistor that are connected between the alarm signal output terminal and a ground, and
  a second switch element connected in parallel with the first resistor or the second resistor,
  wherein the multilevel generation circuit controls the first switch element on the basis of the second signal output from the comparator, and the second switch element on the basis of the first signal.

5. The semiconductor device according to claim 2,
wherein the multilevel generation circuit includes:
  a series circuit of a constant current source, a first resistor, and a second resistor that are connected between a control power-supply voltage terminal and a ground,
  a first switch element connected in parallel with the first resistor, and
  a second switch element connected in parallel with the second resistor,
  wherein a connection point between the constant current source and the first resistor is connected to the alarm signal output terminal, and
  the multilevel generation circuit controls the first switch element and the second switch element on the basis of the first signal, and the second signal output from the comparator.

6. The semiconductor device according to claim 2, wherein
  the multilevel generation circuit is a D/A converter that generates signals of different levels on the basis of the first signal and the second signal.

7. The semiconductor device according to claim 1, wherein the control IC further includes a precaution circuit that includes a pull-up circuit that pulls up an electric potential of the alarm signal output terminal.

8. The semiconductor device according to claim 1, wherein the control IC
  detects overheat abnormality of the power semiconductor switching element by receiving a signal of chip temperature detected by a temperature detection diode formed in the power semiconductor switching element, and
  further includes a precaution circuit that detects a precursory sign of the overheat abnormality of the power semiconductor switching element.

9. The semiconductor device according to claim 1, wherein the control IC
  detects overcurrent abnormality of the power semiconductor switching element by receiving a current signal output from a current sense element that detects an electric current of a main semiconductor switching element through which a main electric current of the power semiconductor switching element flows, and
  further includes a precaution circuit that detects a precursory sign of the overcurrent abnormality of the power semiconductor switching element.

10. A semiconductor device, comprising:
a power semiconductor switching element; and
a control IC configured to
  receive a detection signal for detecting an abnormality of the power semiconductor switching element,
  protect the power semiconductor switching element, and
  output an alarm when a precursory sign of the abnormality or the abnormality is detected based on the detection signal,
wherein the control IC includes:
  an alarm signal output terminal,
  a first comparator configured to compare the detection signal with a first threshold and output a first signal, the first threshold being used for detecting the abnormality, and
  a precaution circuit connected to the alarm signal output terminal, and including a second comparator configured to compare the detection signal with a second threshold and output a second signal, the second threshold being used for detecting the precursory sign of the abnormality, the precaution circuit being configured to
    receive the first signal,
    generate, using the first and second signals, a first alarm signal indicating the precursory sign of the abnormality and a second alarm signal indicating the abnormality, each of the first and second alarm signals having a different voltage level from each other, and
    output the first alarm signal or the second alarm signal as the alarm through the alarm signal output terminal.

* * * * *